US007008061B2

(12) United States Patent  (10) Patent No.: US 7,008,061 B2
Yano                      (45) Date of Patent:     Mar. 7, 2006

(54) COOLING FAN START-UP CONTROL DEVICE FOR LIQUID CRYSTAL PROJECTOR

(75) Inventor: Yoshihiko Yano, Kyotanabe (JP)

(73) Assignee: Sanyo Electric Co., Ltd., Osaka (JP)

( * ) Notice: Subject to any disclaimer, the term of this patent is extended or adjusted under 35 U.S.C. 154(b) by 14 days.

(21) Appl. No.: 10/813,122

(22) Filed: Mar. 31, 2004

(65) Prior Publication Data

US 2004/0196441 A1    Oct. 7, 2004

(30) Foreign Application Priority Data

Apr. 3, 2003 (JP) ............................ 2003-100401

(51) Int. Cl.
*G03B 21/18* (2006.01)
*G03B 21/26* (2006.01)
*G02F 1/1335* (2006.01)

(52) U.S. Cl. .......................................... 353/57; 349/5
(58) Field of Classification Search .................. 353/57, 353/85; 361/695; 165/287; 713/300; 399/44; 123/41.12; 349/5
See application file for complete search history.

(56) References Cited

U.S. PATENT DOCUMENTS

| 5,621,159 | A  |   | 4/1997  | Brown et al. .................... 73/9 |
| 6,550,920 | B1 | * | 4/2003  | Hosoda et al. ................ 353/58 |
| 6,776,489 | B1 | * | 8/2004  | Suzuki ........................ 353/20 |
| 2002/0196606 | A1 |   | 12/2002 | Hirao et al. ................ 361/695 |

OTHER PUBLICATIONS

Patent Abstracts of Japan, vol. 2002, No. 11, Nov. 6, 2002, & JP 2002 209393, Jul. 26, 2002.
European Search Report dated Aug. 3, 2004.

* cited by examiner

*Primary Examiner*—Melissa Jan Koval
(74) *Attorney, Agent, or Firm*—Westerman, Hattori, Daniels & Adrian, LLP

(57) ABSTRACT

A liquid crystal projector comprises a detector for detecting whether a cooling fan is stopped or is being rotated, a first controller for gradually raising a voltage to be applied to the cooling fan when the cooling fan is started, and a second controller for setting the voltage to be applied to the cooling fan to a predetermined normal operating voltage when the detector detects that the cooling fan is rotated in the process of gradually raising the voltage to be applied to the cooling fan by the first controller.

2 Claims, 3 Drawing Sheets

COOLING FAN START-UP CONTROL DEVICE FOR LIQUID CRYSTAL PROJECTOR

BACKGROUND OF THE INVENTION

1. Field of the Invention

The present invention relates to a liquid crystal projector.

2. Description of the Background Art

As light sources for liquid crystal projectors, a metal halide lamp, an extra-high pressure mercury lamp, etc. have been used. The lamps significantly increase in temperature when they are driven. Accordingly, cooling fans have been generally used for the liquid crystal projectors.

The cooling fan is a source of noise. In the recent trend to quiet sound, the cooling fan has been operated in the vicinity of the lower limit of an operation assurance voltage (the minimum voltage at which the rotation of a fan can be maintained after the fan is rotated once) to drive the fan in a state where the number of revolutions is reduced as much as possible, thereby suppressing noise produced from the fan.

However, the minimum voltage required to rotate a fan from a state where the fan is stopped (the minimum voltage for fan starting) is higher than the operation assurance voltage. Accordingly, the minimum voltage for fan starting which is higher than the operation assurance voltage is applied to the cooling fan when the power to the liquid crystal projector is turned on, and the applied voltage is lowered after the fan is started, to achieve quiet sound. Consequently, noise produced by the fan is low at the time of normal operation, while high noise is produced at the time of starting.

Since the minimum voltage for fan starting which is determined in the specification is set to a voltage higher than a voltage required to actually rotate the cooling fan from a state where the cooling fan is stopped, the cooling fan is actually started at a voltage lower than the minimum voltage for fan starting which is determined in the specification.

SUMMARY OF THE INVENTION

An object of the present invention is to provide a liquid crystal projector capable of reducing noise at the time of starting a cooling fan.

A first liquid crystal projector according to the present invention is characterized by comprising detection means for detecting whether a cooling fan is stopped or is being rotated, first control means for gradually raising a voltage to be applied to the cooling fan when the cooling fan is started, and second control means for setting the voltage to be applied to the cooling fan to a predetermined normal operating voltage when the detection means detects that the cooling fan is rotated in the process of gradually raising the voltage to be applied to the cooling fan by the first control means.

A second liquid crystal projector according to the present invention is characterized by comprising a detection circuit for detecting whether a cooling fan is stopped or is being rotated, a first control circuit for gradually raising a voltage to be applied to the cooling fan when the cooling fan is started, and a second control circuit for setting the voltage to be applied to the cooling fan to a predetermined normal operating voltage when the detection circuit detects that the cooling fan is rotated in the process of gradually raising the voltage to be applied to the cooling fan by the first control circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
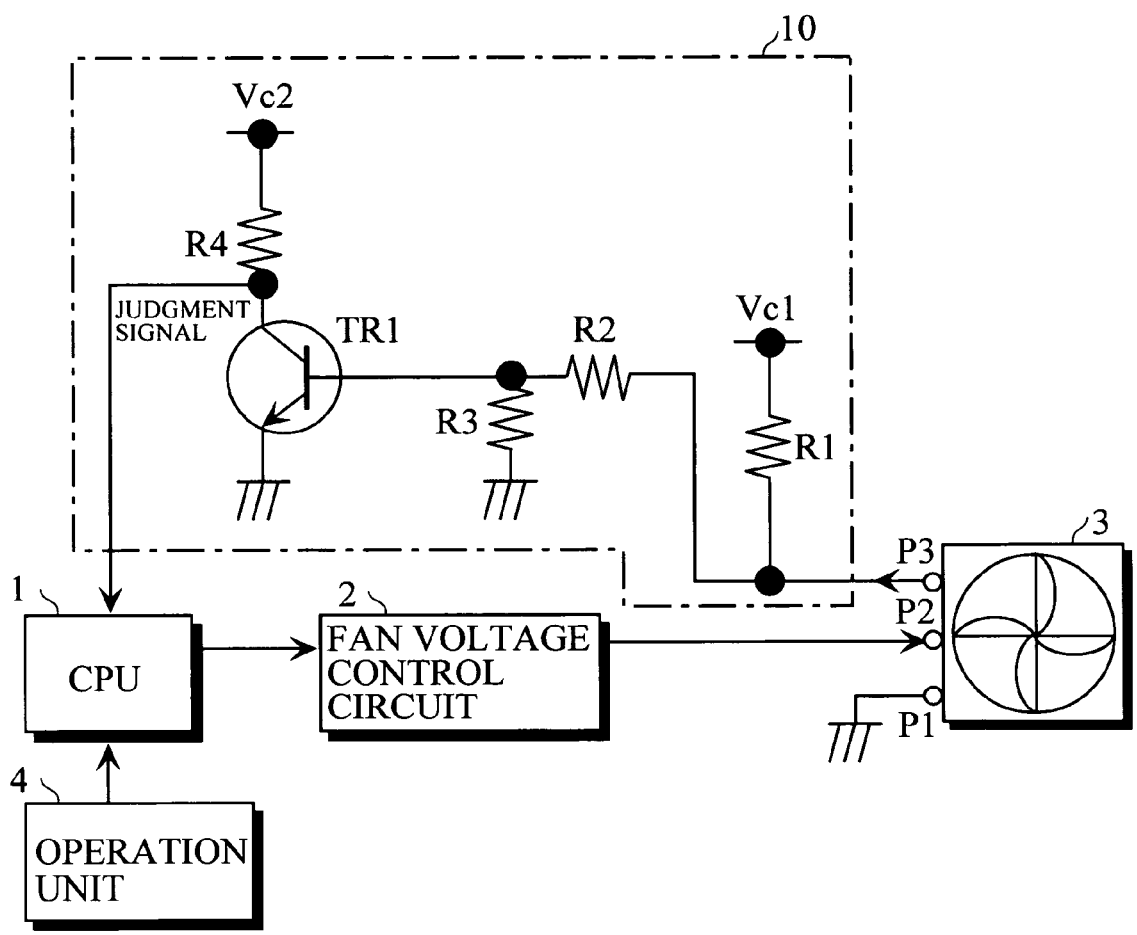
FIG. 1 is a block diagram showing a circuit for controlling a cooling fan provided in a liquid crystal projector.

Referring now to the drawings, description is now made of an embodiment of the present invention.

FIG. 1 illustrates a circuit for controlling a cooling fan provided in a liquid crystal projector.

A CPU 1 comprises a ROM (not shown) storing its program and others, and a RAM (not shown) storing necessary data. A fan voltage control circuit 2 controls a driving voltage for a cooling fan 3 on the basis of a control signal from the CPU 1. An operation signal from an operation unit (a remote control, an operating unit on the main body side) 4 is inputted to the CPU 1.

The cooling fan 3 comprises the function of outputting a signal indicating whether the fan is stopped or is being rotated. The cooling fan 3 comprises a ground terminal P1, a voltage application terminal P2, and a LOCK sensor terminal P3. The ground terminal P1 is grounded. The voltage application terminal P2 is connected to an output terminal of the fan voltage control circuit 2.

The LOCK sensor terminal P3 is a terminal for outputting a signal indicating whether the fan is stopped or is being rotated. A potential at the LOCK sensor terminal P3 is held at a High level in a state where the fan is stopped, while being held at a Low level in a state where the fan is being rotated.

A fan stop/rotation judgment circuit 10 is connected to the LOCK sensor terminal P3. The fan stop/rotation judgment circuit 10 comprises resistors R1 to R4 and a switching transistor TR1.

A first DC power supply Vc1 is connected to the LOCK sensor terminal P3 through the resistor R1, and is connected to the base of the switching transistor TR1 through a bias circuit comprising the resistors R1, R2, and R3. A second DC power supply Vc2 is connected to the collector of the switching transistor TR1 through the resistor R4. The emitter of the switching transistor TR1 is grounded. A fan stop/rotation judgment signal corresponding to a voltage at a collector terminal of the switching transistor TR1 is inputted to the CPU 1.

When the cooling fan 3 is stopped, the potential at the LOCK sensor terminal P3 is at a High level. Accordingly, a current flows in the base of the switching transistor TR1 from the first DC power supply Vc1 through the bias circuit comprising the resistors R1, R2, and R3. Therefore, the switching transistor TR1 is turned on, so that the fan stop/rotation judgment signal enters a Low level.

On the other hand, when the cooling fan 3 is being rotated, the potential at the LOCK sensor terminal P3 is at a Low level. Accordingly, a current flows in the LOCK sensor terminal P3 from the first DC power supply Vc1. Therefore, the switching transistor TR1 is turned off, so that the fan stop/rotation judgment signal enters a High level.

Figure 3:
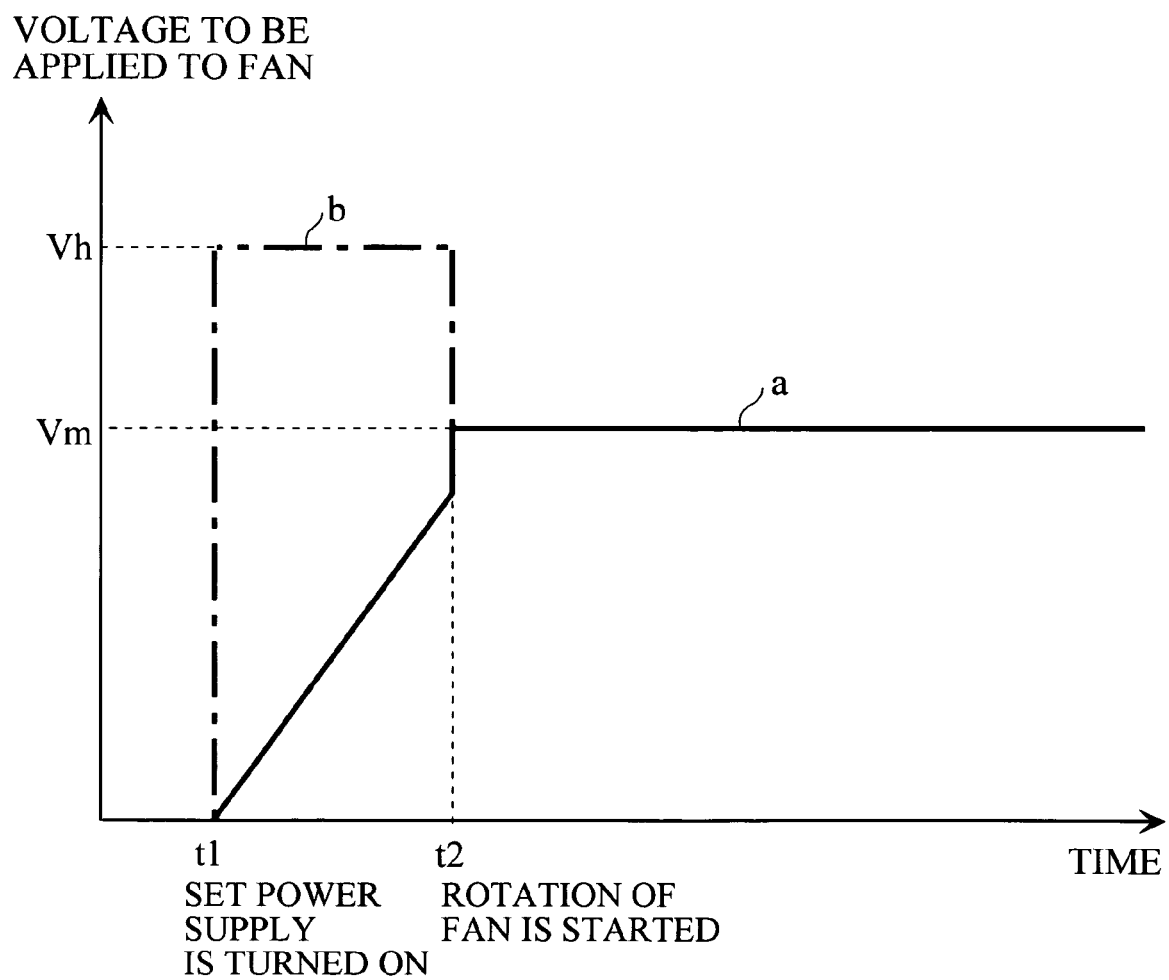
FIG. 3 is a graph showing the change in fan voltage at the time of starting a cooling fan.

In the present embodiment, the CPU 1 controls the fan voltage control circuit 2 such that a voltage to be applied to the cooling fan 3 (a fan voltage) is changed, as indicated by a solid line a in FIG. 3, when the cooling fan 3 is started, that is, when the power to the liquid crystal projector is turned on (at a time point t1). That is, the voltage to be applied to the cooling fan is gradually raised when the cooling fan is started, and is set to a predetermined normal operating voltage when it is detected in the process of gradually raising the voltage to be applied to the cooling fan that the cooling fan is rotated (at a time point t2).

Figure 2:
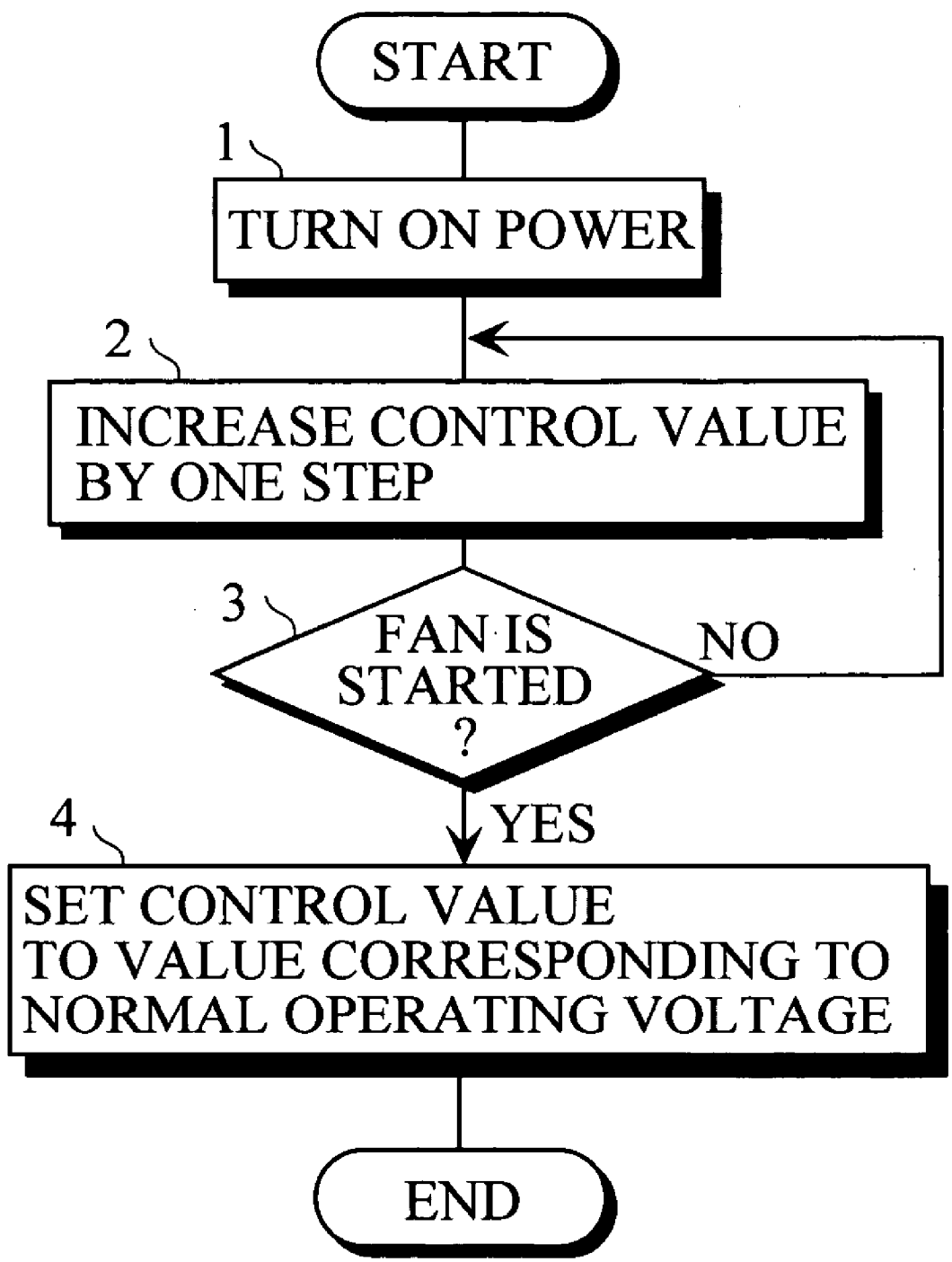
FIG. 2 is a flow chart showing the procedure for fan voltage control processing by a CPU 1.

FIG. 2 shows the procedure for fan voltage control processing by the CPU 1.

When the power to the liquid crystal projector (a set power supply) is turned on (step 1), a control value to the fan voltage control circuit 2 is increased by one step for each predetermined time interval such that the fan voltage is gradually raised (step 2). Every time the control value is increased by one step, it is judged whether or not the cooling fan 3 is started (rotated) on the basis of the fan stop/rotation judgment signal (step 3).

When it is detected that the cooling fan 3 is started (rotated) in the process of gradually raising the fan voltage outputted from the fan voltage control circuit 2 (YES in step 3), the control value to the fan voltage control circuit 2 is set to a control value corresponding to the normal operating voltage such that the fan voltage is a predetermined normal operating voltage (set in the vicinity of the lower limit of the operation assurance voltage) Vm (step 4). Consequently, the fan voltage outputted from the fan voltage control circuit 2 is the predetermined normal operating voltage.

A broken line b in FIG. 3 indicates the conventional change in the fan voltage at the time when the power to the liquid crystal projector is turned on. That is, in the conventional example, when the power to the liquid crystal projector (the set power supply) is turned on, the fan voltage control circuit 2 is controlled such that the fan voltage is the minimum voltage for fan starting Vh which is determined in the specification, and is controlled such that the fan voltage is the normal operating voltage Vm after an elapse of a predetermined time period.

As described in the foregoing, the minimum voltage for fan starting Vh which is determined in the specification is actually set to a voltage higher than a voltage required to rotate the cooling fan from a state where the cooling fan is stopped. Therefore, the fan voltage control described in the present embodiment allows the cooling fan 3 to be started at a voltage lower than the minimum voltage for fan starting Vh which is determined in the specification.

In the present embodiment, therefore, the voltage to be applied to the cooling fan 3 at the time of starting the cooling fan 3 can be made lower, and noise produced by the cooling fan 3 can be made lower, as compared with those in the conventional example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A cooling fan start-up control device for a liquid crystal projector comprising:
   detection means for detecting whether a cooling fan is stopped or is being rotated;
   first control means for gradually raising a voltage to be applied to the cooling fan from a state where the cooling fan is stopped, when starting the cooling fan; and
   second control means for setting the voltage to be applied to the cooling fan to a predetermined normal operating voltage when the detection means detects that the cooling fan starts to rotate, in the process of gradually raising the voltage to be applied to the cooling fan by the first control means.

2. A cooling fan start-up control device for a liquid crystal projector comprising:
   a detection circuit for detecting whether a cooling fan is stopped or is being rotated;
   a first control circuit for gradually raising a voltage to be applied to the cooling fan from a state where the cooling fan is stopped, when starting the cooling fan; and
   a second control circuit for setting the voltage to be applied to the cooling fan to a predetermined normal operating voltage when the detection circuit detects that the cooling fan starts to rotate, in the process of gradually raising the voltage to be applied to the cooling fan by the first control circuit.

* * * * *